(12) United States Patent
Brundridge

(10) Patent No.: US 7,720,637 B2
(45) Date of Patent: May 18, 2010

(54) SYSTEMS AND METHODS FOR EFFICIENT UTILIZATION OF POWER SOURCES IN A REDUNDANT CONFIGURATION

(75) Inventor: Michael Brundridge, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 146 days.

(21) Appl. No.: 11/936,150

(22) Filed: Nov. 7, 2007

(65) Prior Publication Data

US 2009/0119064 A1 May 7, 2009

(51) Int. Cl.
*G01R 31/40* (2006.01)
(52) U.S. Cl. .......................... 702/182; 702/57; 702/60; 307/43
(58) Field of Classification Search .................. 702/182, 702/57, 60; 363/69, 81, 71; 307/58, 82, 307/43
See application file for complete search history.

(56) References Cited

U.S. PATENT DOCUMENTS

| | | | | |
|---|---|---|---|---|
| 4,451,773 A | * | 5/1984 | Papathomas et al. | 320/128 |
| 5,428,523 A | * | 6/1995 | McDonnal | 363/71 |
| 5,751,564 A | | 5/1998 | Dien | 363/37 |
| 5,959,370 A | | 9/1999 | Pardo | 307/77 |
| 6,674,836 B2 | | 1/2004 | Harada et al. | 378/107 |
| 6,930,895 B2 | | 8/2005 | Yamada et al. | 363/21.18 |
| 2007/0260896 A1 | | 11/2007 | Brundridge et al. | 713/300 |

OTHER PUBLICATIONS

DC-11240, Dell Application Entitled "Apparatus and Methods for Managing Power in an Information Handling System", Brundridge et al., 16 pages, Sep. 26, 2006.

* cited by examiner

*Primary Examiner*—Drew A Dunn
*Assistant Examiner*—Hien X Vo
(74) *Attorney, Agent, or Firm*—Baker Botts L.L.P.

(57) ABSTRACT

A method may include generating an efficiency curve for each of a plurality of power sources and operating the plurality of power sources based at least on the generated efficiency curve. Generating the efficiency curve for each power source may include coupling a test load to the power source for a period of time, measuring an output power after the period of time, determining a productivity of the power source, determining an efficiency of each power source based at least on the measured output power and the determined productivity, repeating the efficiency determination of the power source for a plurality of different test loads, and generating an efficiency curve from at least the determined efficiencies.

20 Claims, 3 Drawing Sheets

SYSTEMS AND METHODS FOR EFFICIENT UTILIZATION OF POWER SOURCES IN A REDUNDANT CONFIGURATION

TECHNICAL FIELD

The present disclosure relates to system power management, and more particularly, to efficient power source usage in a redundant power source configuration.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as, but not limited to, financial transaction processing, airline reservations, enterprise data storage, or global communications. In addition, information handling systems may include a variety of hardware and software components that may be configured to process, store, and communicate information and may include one or more computer systems, data storage systems, and networking systems.

With the advent of power hungry information handling systems, power management has become more important. In the past, conserving power has typically been secondary to speed and processor availability. However, due to the increased processing demands required by today's software and Internet websites, more information handling systems utilize multi-processor systems that require more power to operate than single processor computer systems. In addition, as processor designs continue to scale up in speed and density, corresponding power consumption can increase dramatically, requiring more efficient power management.

While the processing demands and device consumptions are often driving factors in managing and conserving power, other factors such as network failures, blackouts, and other device, system, or mechanical failures may also be motivators in reducing and efficiently managing power consumption. Current solutions often employ a power source management, sequencing, and conservation technique to handle the inrush and steady state load demands, as well as redundancy and efficiency requirements of power sources. Demand triggered power sources have attempted to reduce power consumption by starting up additional power sources based upon the load on the system. However, the current techniques generally do not account for inrush source, choose the most efficient power source to start from a pool of available power sources, or provide for enterprise wide power conservation.

Further, in multiple redundant power sources, and where the power sources are load sharing, the more power sources brought online generally causes a reduction in efficiency. For example, a power source with a rating of 600 Watts may operate at about 600 Watts (minus any loss due to a load). Alternatively, in a redundant configuration, two power sources, each with a 600 Watt rating, may both be coupled to a single load and may each have an output of about 300 Watts, thus not effectively using the power sources.

SUMMARY

In accordance with an embodiment of the present disclosure, a method may include generating an efficiency curve for each of a plurality of power sources and operating the plurality of power sources based at least on the generated efficiency curve. Generating the efficiency curve for each power source may include coupling a test load to the power source for a period of time, measuring an output power after the period of time, determining a productivity of the power source, determining an efficiency of each power source based at least on the measured output power and the determined productivity, repeating the efficiency determination of the power source for a plurality of different test loads, and generating an efficiency curve from at least the determined efficiencies.

In accordance with another embodiment of the present disclosure, a method for operating a plurality of power sources configured in a redundant configuration based at least on a generated efficiency curve is provided. An efficiency of at least one power source of the plurality of power source may be determined and a corresponding data point may be generated. The method may also include determining other efficiency and generating other data point generation for a plurality of other test loads. An efficiency curve from the generated data points may be generated and the plurality of power sources may be operated based at least on the generated efficiency curve.

In accordance with a further embodiment of the present disclosure, an information handling system may include a processor, a memory communicatively coupled to the processor, display device coupled to the processor, a plurality of power sources coupled to the processor, and a controller may be provided. The controller may be communicatively coupled to the plurality of power sources. In addition, the controller may be operable to couple a test load to each of the power sources for a period of time, measure an output power after the period of time, determine a productivity of the power source, and determine an efficiency of power source based at least on the measured output power and the determined productivity. The controller may further be operable to repeat the efficiency determination of the power source for a plurality of different test loads and generate an efficiency curve from the efficiency determinations. The controller may operate the plurality of power sources based at least on the generated efficiency curve.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-5, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and/or a video display. The information handling system may also include one or more buses operable to transmit communications between the various hardware components.

Figure 1:
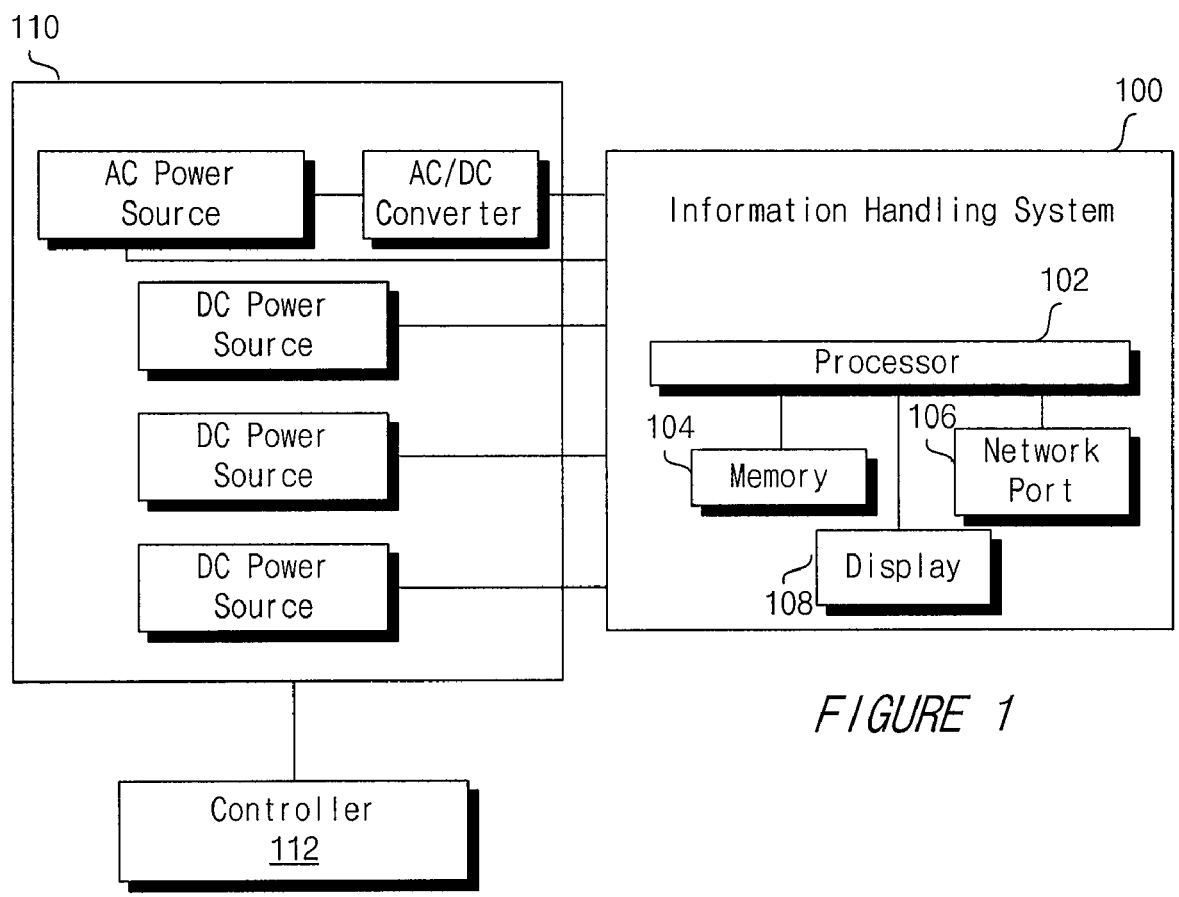
FIG. 1 illustrates a block diagram of an example information handling system, in accordance with embodiments of the present disclosure.

FIG. 1 illustrates a block diagram of an example information handling system 100, in accordance with an embodiment of the present disclosure. As shown in FIG. 1, information handling system 100 may include a processor 102, memory 104, a network port 106, a display 108, and a plurality of redundant power sources 110. Processor 102 may comprise any system, device, or apparatus operable to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 102 may interpret and/or execute program instructions and/or process data stored in memory 104 and/or another component of information handling system 100 and may output results, graphical user interfaces (GUIs), websites, and the like via display 108 or over network port 106.

Memory 104 may be coupled to processor 102 and may comprise any system, device, or apparatus operable to retain program instructions or data for a period of time. Memory 104 may be random access memory (RAM), electrically erasable programmable read-only memory (EEPROM), a PCM-CIA card, flash memory, or any suitable selection and/or array of volatile or non-volatile memory that retains data after power to information handling system 100 is turned off.

Display 108 may comprise any display device suitable for creating graphic images and/or alphanumeric characters recognizable to a user, and may include, for example, a liquid crystal display (LCD) or a cathode ray tube (CRT).

Network port 106 may be any suitable system, apparatus, or device operable to serve as an interface between information handling system 100 and a network. Network port 106 may enable information handling system 100 to communicate over a network using any suitable transmission protocol and/or standard, including without limitation all transmission protocols and/or standards known in the art.

Power sources 110 may include any device, system, or apparatus operable to supply power or electrical energy to one or more components of information handling system 100. For example, power sources 110 may include any system, device, and/or apparatus operable to supply direct current (DC) electrical power to one or more components of information handling system 100. In some embodiments, a DC power source may comprise a battery. In the same or alternative embodiments, a DC power source may comprise an AC/DC adapter that may convert 120- or 240-volt (or any other suitable voltage) alternating current supplied by a utility company to a regulated lower voltage DC power source. In addition, an AC/DC adapter may also charge a battery while supplying power to information handling system 100.

In addition or alternatively, power sources 110 may include any system, device, and/or apparatus operable to supply AC electrical power directly to one or more components of an information handling system. In some embodiments, the AC power source may subsequently be converted into a DC power source (e.g., using an AC/DC converter).

In some embodiments, power sources 110 may include one or more uninterruptible power sources and/or switch mode power sources either internal and/or coupled externally to information handling system 100. In some embodiments, power sources 110 may be assembled in a redundant configuration (e.g., one or more power sources may be configured to share a load current such that failure of a single power source may not substantially affect the load current) within, for example, a multi-source chassis that may be coupled to information handling system 100. Alternatively, power sources 110 may include an array of power sources, e.g., an array of programmable DC power sources.

A controller 112 may be coupled to the plurality of power sources 110. Controller 112 may include any hardware, firmware, and/or software for determining the productivity of individual power sources 110 as well as the productivity of various combinations of power sources 110 (e.g., in a load sharing configuration). For example, controller 112 may read each power source's field replaceable unit (FRU) or nameplate to determine the power rating of each power source 110. Controller 112 may also test power sources 110 to determine the input and/or output capabilities of one, some, or all of power sources 110 for supplying power to various loads. This may allow controller 112 to apply power sources 110 to components of information handling system 100 efficiently (e.g., to efficiently provide power to the various components or loads associated with information handling system 100). This process is described in more detail below.

Figure 2:
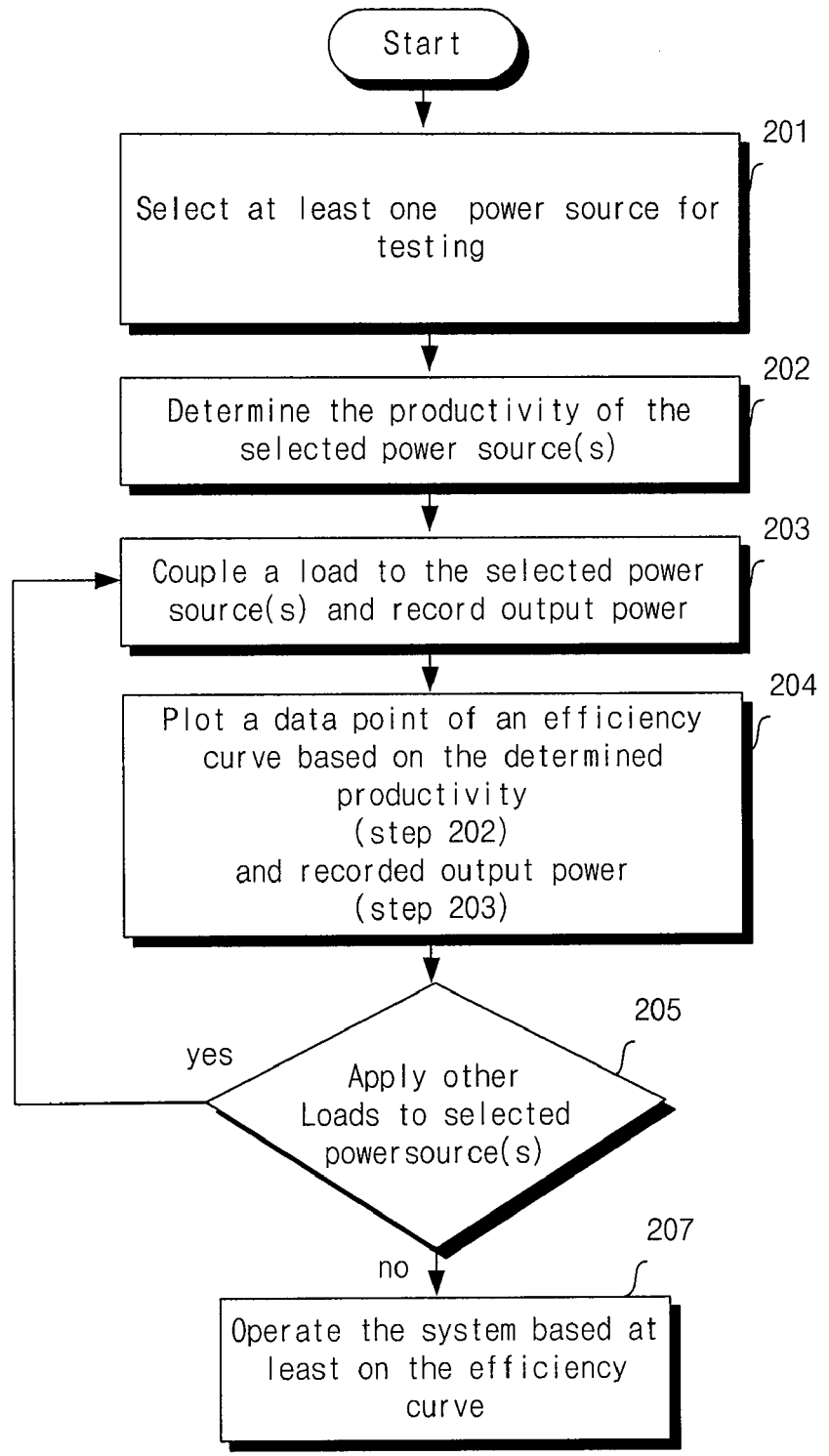
FIG. 2 illustrates a flow chart of an example method for determining the efficiency of a power source, in accordance with embodiments of the present disclosure.

FIG. 2 illustrates a method for efficiently utilizing a redundant power source configuration, in accordance with an embodiment of the present disclosure. At step 201, controller 112 may select and/or characterize at least one power source 110. Controller 112 may be in direct or indirect communication with each of the power sources 110 and may be able to power on or off each power source 110 during the selection step. In some embodiments, controller 112 may select each power source 110 in a serial manner for testing. Controller 112 may select one or more than one power source 110 for testing.

At step 202, controller 112 may determine the productivity of the selected power source(s) 110. For example, controller 112 may read the replaceable unit (FRU) or nameplate of the power source(s) 110 to determine the rated output power of selected power source(s) 110.

At step 203, controller 112 may couple a load to the selected power source 110 and power on the selected power source(s) 110. One, some, or all the components of system 100 may be used as a test load. Alternatively, controller 112 may couple other test loads known in the art to the selected power source(s) 110. In one embodiment, after coupling the test load to the selected power source(s) 110, controller 112 may turn on the power source(s) 110, wait for the power source(s) 110 to stabilize, and record sample input and/or output power taken from the power source(s) 110. To ensure the test load is stabilized while coupled to the power source (s), some or all components of information handling system 100 may be placed in a reset state or in a memory test state such that the power load is stable. The stable load may allow controller 112 to sample the power source(s) over a period of time, which may provide a more accurate output power readout as compared to a test load that varies over the period of time.

At step 204, a data point representing the power efficiency of the selected power source 110 coupled to the test load may be determined and plotted on a graph. The power efficiency data point may be based on at least the productivity of the selected power source (from step 202) and the recorded output power (step 203) for the test load. For example, the power efficiency may be a ratio of the output power recorded for a given load to the rated power output for the selected power source 110.

At step 205, a determination is made whether to test the selected power source(s) 110 using one or more other test loads. If so, controller 112 may couple one or more other test loads to the selected power source(s) 110 and repeat steps 203 and 204 to determine one or more additional power efficiency data points for the selected power source 110. Alternatively, as discussed below with reference to the method of FIG. 3, controller 112 may combine the selected power source(s) 110 with one or more additional power sources 110 and test the combined power sources 110 using one or more test loads (e.g., using a shared load configuration).

Steps 203 and 204 may be repeated any number of times, using any selected test loads and additional power sources 110 in order to generate additional data points. The data points may be plotted to generate an efficiency curve for the selected power source(s) 110, e.g., as discussed below with reference to FIG. 4 or 5.

At step 207, once an efficiency curve (or efficiency curves) have been generated for the selected power source(s) 110, controller 112 may utilize the efficiency curve(s) (along with a redundancy policy associated with system 100) to manage the power efficiency of system 100. It is noted that for each system, the efficiency with respect to the percentage of output power may vary.

For example, controller 112 may review the efficiency curves for each power source 110, or any combination of the power sources 110, to determine which power source 110 or power sources 110 may be efficient to power one, some or all of the components of information handling system 100.

Figure 3:
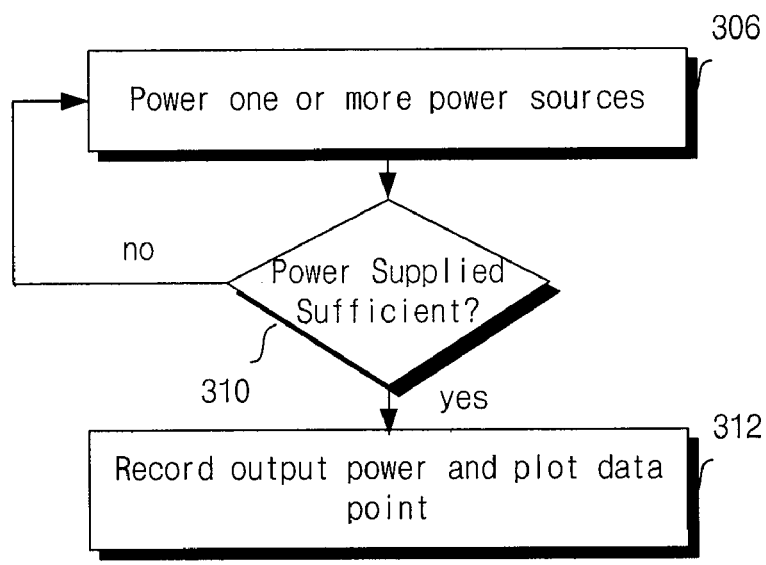
FIG. 3 illustrates a flow chart of an example method for determining the efficiency of one or more power sources, in accordance with embodiments of the present disclosure.

FIG. 3 illustrates a flowchart for testing multiple power sources 110 at step 203 of the method shown in FIG. 2, according to embodiments of the present disclosure. At step 306, controller 112 may power on one or more additional power sources 110 (i.e., in addition to the original selected power source(s) 110) and couple the additional power source (s) 110 with power source(s) 110 selected at step 201 of the method of FIG. 2. The multiple powered power sources 110 may then be coupled to a test load.

At step 310, controller 112 may determine if the powered power sources 110 (i.e., the power source(s) selected at step 201 and the additional power source(s) powered at step 306) are collectively capable or sufficient to power the test load. If the output power of the powered sources are sufficient, at step 312, controller 112 may record the output power of power sources 110 and plot a data point, e.g., as described above regarding steps 203 and 204 of FIG. 2.

However, as shown in FIG. 3, if the output power of the powered power sources 110 is not sufficient to power the test load, the method may return to step 306 and controller 112 may turn on additional power sources 110. In addition or alternatively, controller 112 may power off at least one of the powered sources 110 to test the efficiency of the selected power sources 110 from step 201 and any remaining powered sources from step 306. For example, in embodiments where more than one power source 110 is powered on, controller 112 may power on a new power source 110 and turn off a prior powered power source 110.

The processes described above regarding FIGS. 2 and 3 may be repeated any number of times in order to generate multiple data points, and thus efficiency curves, for individual power sources 110 and/or various combination of multiple power sources 110. One of ordinary skill in the art may recognize the more data points plotted for a particular efficiency curve, the more accurate or useful the curve.

Figure 4:
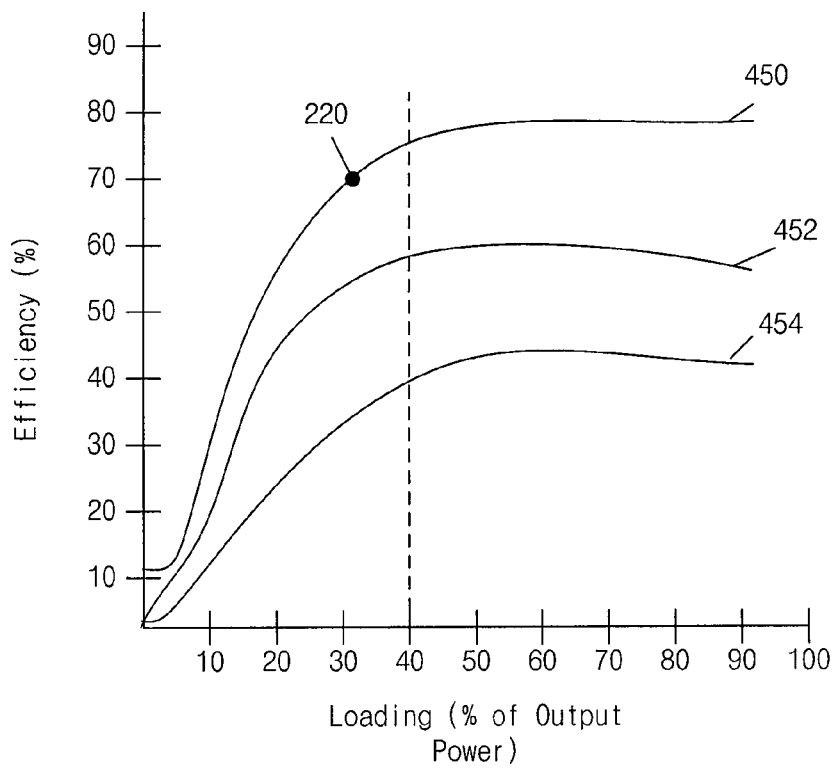
FIGS. 4 and 5 each illustrate a set of example efficiency curves, in accordance with embodiments of the present disclosure.

FIG. 4 illustrates example efficiency curves for a plurality of power sources 110, in accordance to embodiments of the present disclosure. In particular, 450 may represent a first power source of power sources 110, efficiency curve 452 may represent the efficiency of a second power source of power sources 110, and efficiency curve 454 may represent the efficiency of the combination of the first and second power sources. Data point 220 represents an example data point, which may be generated at step 204 in FIG. 2, for example.

To illustrate with an example, if the load from information handling system 100 requires about 40% of the output power supplied by power sources 110, controller 112 may look to efficiency curve 450, 452, and 454 to determine which power sources are needed. At 40%, the first power source 110 with efficiency curve 450 may provide the most efficiency as compared to second power source 110 and the combination of the first and second power sources 110. By utilizing the efficiency curve, only the necessary power source(s) 110 needed for a load may be powered and applied to the various components of information handling system 100.

Figure 5:
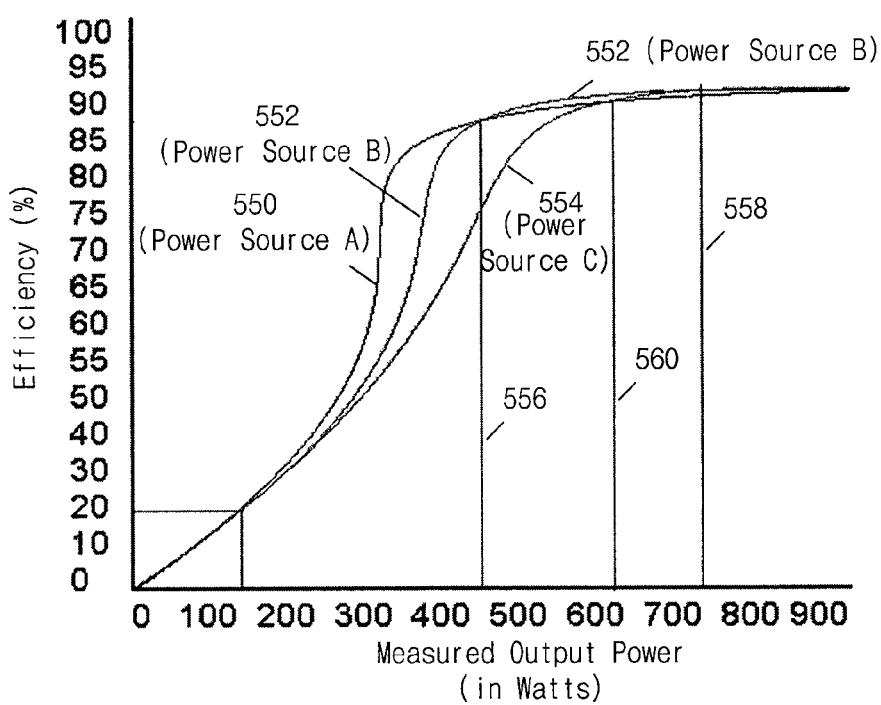

FIG. 5 illustrates another set of example efficiency curves, in accordance with embodiments of the present disclosure. Efficiency curve 550 may represent a first 900 Watt power source (Power Source A), efficiency curve 552 may represent the efficiency of a second 900 Watt power source (Power Source B), and efficiency curve 554 may represent a third 900 Watt power source (Power Source C).

To illustrate with an example, if one or more components of information handling system 100 require less than about 450 Watts, Power Source A may preferably be used for powering such component(s). Referring to efficiency curve 550 of FIG. 5, at the wattages below 450 (line 556), Power Source A is more efficient than Power Source B or Power Source C.

Likewise, if one or more components of information handling system 100 require between 450 and 750 Watts, Power Source B may preferably be used for powering such component(s). Referring to efficiency curve 552, between 450 Watts (line 556) and 750 Watts (line 558), Power Source B is more efficient than Power Source A or Power Source C.

For any load greater than about 750 watts (line 558), the efficiency of Power Sources A, B, and C are about the same, and thus any of the power sources may be used.

In a redundant configuration where, for example, two power sources may be provided redundantly, a combination of curves 550, 552, and/or 554 may be evaluated by controller 112. For example, between about 0 to 625 Watts (line 560), efficiency curves 550, 552, and 554 indicate that Power Sources A and B are a more efficient combination than Power Sources A and C or Power Sources B and C (particularly due to the relative inefficiency of Power Source C below 625 Watts).

By utilizing efficiency curves generated as described herein, controller 112 may apply the appropriate power source(s) 110 (either in a non-redundant or redundant configuration) to one, some, or all components of information handling system 100 in order to increase or maximize the power efficiency of system 100.

Although the present disclosure has been described in detail, it should be understood that various changes, substitutions, and alterations can be made hereto without departing from the spirit and the scope of the invention as defined by the appended claims.

What is claimed is:

1. A method, comprising:
    generating an efficiency curve for each of a plurality of power sources, wherein generating the efficiency curve for each power source includes:
        coupling a test load to the power source for a period of time;
        measuring an output power after the period of time;
        determining a productivity of the power source;
        determining an efficiency of each power source based at least on the measured output power and the determined productivity;
        repeating the efficiency determination of the power source for a plurality of different test loads; and
        generating an efficiency curve from at least the determined efficiencies; and
    operating the plurality of power sources based at least on the generated efficiency curve.

2. The method of claim 1, wherein providing the plurality of power sources comprises providing a plurality of direct current sources, alternating current sources, or alternating and direct current sources.

3. The method of claim 1, wherein providing the plurality of power sources comprises providing a plurality of power sources in a redundant configuration.

4. The method of claim 1, wherein determining a productivity of each power source comprises determining a field replacement unit value.

5. The method of claim 4, wherein determining an efficiency of each powered source comprises comparing the amount of field replacement unit value and the measured power.

6. The method of claim 1, wherein repeating the determined efficiency comprises determining an efficiency for more than one power sources.

7. The method of claim 6, wherein repeating the determined efficiency comprises determining an efficiency of at least two power sources for a shared test load between the at least two power sources.

8. The method of claim 1, wherein repeating the determined efficiency comprises coupling one of the plurality of other test loads to the power source.

9. A method, comprising:
    providing a plurality of power sources in a redundant configuration;
    determining an efficiency of at least one power source of the plurality of power sources with respect to a test load;
    generating a data point corresponding to the efficiency of the at least one power source;
    repeating the efficiency determination and data point generation for a plurality of other test loads;
    generating an efficiency curve from the generated data points; and
    operating the plurality of power sources based at least on the generated efficiency curve.

10. The method of claim 9, wherein determining the efficiency comprises determining a productivity of the at least one power source.

11. The method of claim 10, wherein the productivity comprises a field replacement unit value.

12. The method of claim 10, wherein determining an efficiency comprises coupling the test load to the at least one power source and determining the output power.

13. The method of claim 12, wherein the test load comprises a shared test load coupled to at least two power sources.

14. The method of claim 12, wherein determining the efficiency is based on at least the productivity and the output power.

15. An information handling system comprising:
    a processor;
    a memory communicatively coupled to the processor;
    a display device coupled to the processor;
    a plurality of power sources coupled to the processor; and
    a controller operably configured to, for each power source of the plurality of power sources:
        couple a test load to the power source for a period of time;
        measure an output power after the period of time;
        determine a productivity of the power source;
        determine an efficiency of each power source based at least on the measured output power and the determined productivity;
        repeat the efficiency determination of the power source for a plurality of different test loads;
        generate an efficiency curve from the efficiency determinations; and
        operate the plurality of power sources based at least on the generated efficiency curve.

16. The information handling system of claim 15, wherein the plurality of power sources are configured in a redundant configuration.

17. The information handling system of claim 15, wherein the plurality of power sources comprises providing a plurality of direct current sources, alternating current sources, or alternating and direct current sources.

18. The information handling system of claim 15, wherein coupling the test load comprises coupling the processor, the memory, the display, or a combination thereof to the power source.

19. The information handling system of claim 15, wherein operating the plurality of power sources further comprises operating the plurality of power sources based at least on the load of the information handling system.

20. The information handling system of claim 15, wherein determining efficiency further comprises determining an efficiency for more than one power sources.

* * * * *